United States Patent [19]

Shimizu

[11] Patent Number: 4,584,683
[45] Date of Patent: Apr. 22, 1986

[54] LOGIC CIRCUIT TEST SYSTEM

[75] Inventor: Masao Shimizu, Gyoda, Japan

[73] Assignee: Takeda Riken Co., Ltd., Tokyo, Japan

[21] Appl. No.: 554,337

[22] Filed: Nov. 22, 1983

[30] Foreign Application Priority Data

Nov. 25, 1982 [JP]  Japan ................................ 57-206507

[51] Int. Cl.[4] ............................................ G01R 31/28
[52] U.S. Cl. ........................................ 371/25; 371/27
[58] Field of Search ............................ 371/27, 25, 21;
        364/200, 900; 324/73 R, 73 AT, 73 PC

[56] References Cited

U.S. PATENT DOCUMENTS

| | | | |
|---|---|---|---|
| 4,293,950 | 10/1981 | Shimizu et al. | 371/21 |
| 4,313,200 | 1/1982 | Nishiura | 371/25 |
| 4,369,511 | 1/1983 | Kimura et al. | 371/21 |
| 4,402,081 | 8/1983 | Ichimiya et al. | 371/21 |

Primary Examiner—Charles E. Atkinson
Attorney, Agent, or Firm—Staas & Halsey

[57] ABSTRACT

A test pattern generator for providing test patterns to a logic circuit under test, wherein the logic circuit to be tested does not have a terminal for being set to an initial state before starting the test patterns. The initial state of the logic circuit is detected while supplying an increment pattern to increment the internal state, and the test patterns are supplied a predetermined number of clock pulses after the initial state is detected. The length of the period of the clock pulses for the test can be varied.

9 Claims, 7 Drawing Figures

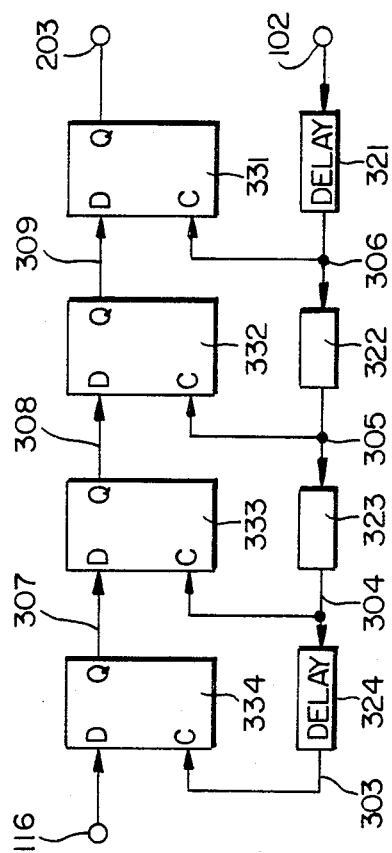
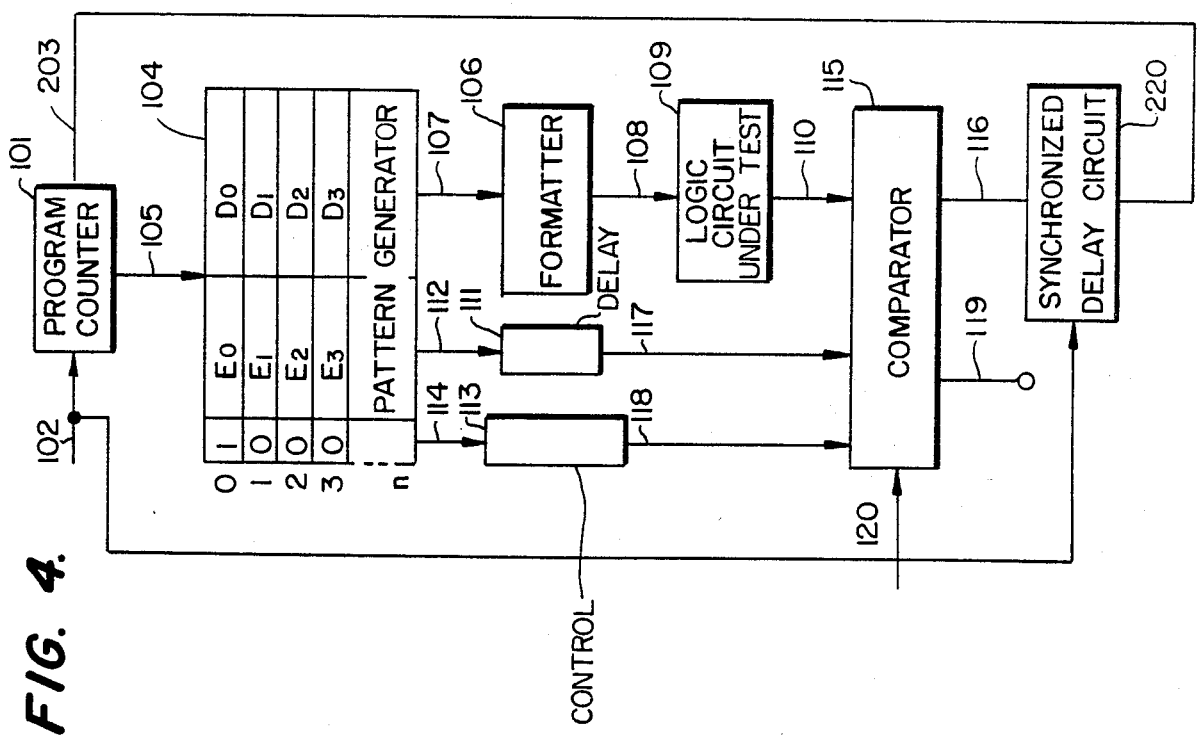
FIG. 5.
FIG. 4.

LOGIC CIRCUIT TEST SYSTEM

BACKGROUND OF THE INVENTION

This invention relates to a logic circuit test system for testing a logic circuit by supplying test patterns to the logic circuit and for comparing response outputs from the logic circuit with expected patterns, and more particularly to a logic circuit test system capable of changing the address sequence for generating the test patterns and the expected patterns.

In testing a logic circuit, test patterns and expected patters are simultaneously generated by a pattern generator provided in the logic circuit test system. The test patterns are supplied to a logic circuit under test and the resulting outputs from the logic circuit are compared by a comparator with the expected patterns to determine whether the logic circuit works correctly or not. Prior to supplying the test patterns to the logic circuit under test the logic circuit under test has to be set to an initial state, or to a reset state, for applying the test patterns beginning with the initial state. For initializing the logic circuit under test, the logic test system supplies, for instance, a reset signal to the logic circuit under test. The test patterns and expected patterns are data of plural bits, for respective pins of the logic circuit to be tested.

However, some logic circuits, for example, microprocessors or watch circuits and the like, do not have a special terminal such as a reset terminal for initializing their internal state. In the logic circuit of this kind, the internal state is incremented cyclically by a specific logic pattern inherent to the logic circuit (hereinafter referred to by increment pattern). By incrementing the internal state a predetermined number of times, for example 60 times, the internal state returns to the initial state. That is, by incrementing the internal state every 60 times as in the above example, the initial state of the logic circuit is repeatedly set. The number of times of applying the increment pattern to the logic circuit for repeating the same internal state is inherent to the logic circuit and is known from, for example, the technical description of the logic circuit under test. However, the internal state of the logic circuit under test at the time of beginning the application of the increment pattern is not known, since the internal state at that time depends on the previous operation of the logic circuit, or on the uncertainty which occurred when switching on the source power. Thus in the above example of repeating the same internal state when applying the increment pattern every 60 times, there is a possibility that the first initial state will occur on applying the increment pattern anywhere from 0 to 59 times, depending on the internal state just prior to the increment pattern.

For initializing and testing a logic circuit of this kind, a pattern generator disposed in the logic circuit test system repeatedly generates an increment pattern corresponding to the logic circuit that is to be tested for incrementing the internal state, and an expected pattern indicating the initial state of the logic circuit. The increment pattern is provided to the logic circuit under test, and the resulting output from the logic circuit under test is compared with the expected pattern by a comparator for detecting the initial state. When the output signal from the logic circuit and the expected pattern coincide with each other, a coincidence signal is generated by the comparator so that a logic circuit test is started by applying real test patterns for evaluating the logic circuit.

FIG. 1 shows a block diagram of a conventional logic circuit test system capable of testing a logic circuit of this kind. In FIG. 1, a program counter 101 is incremented by a clock signal 102. The program counter 101 provides the addresses 105 to a pattern generator 104. The other terminal of the program counter 101 is supplied with a coincidence signal 103 from a comparator 115. When the coincidence signal 103 is at low level, the program counter 101 repeatedly generates the address 0 of the pattern generator 104. On the other hand, when the coincidence signal 103 is at high level, the program counter 101 generates the address 105 incrementing by one step in synchronization with each clock signal 102 in the order of the addresses 1, 2, 3 . . . and provides the addresses to the pattern generator 104.

In the pattern generator 104, there are stored test patterns $D_n$ to $D_n$ for testing the logic circuit 109, expected patterns $E_0$ to $E_n$ for comparison with the data from the logic circuit under test 109, and control data 1, 0, 0, 0 . . . for controlling the timing of the comparator 115 to selectively provide therefrom either a coincidence signal or a comparison signal. The test patterns, expected patterns and control data are selectively output as signals 107, 112 and 114, respectively. The test patterns from the pattern generator 104 are supplied to a formatter 106 in which the test patterns are shaped to predetermined logic waveforms such as return-to-zero (RZ), non-return-to zero (NRZ) signals and the like. The test patterns shaped and delivered by the formatter 106 are provided to a logic circuit 109 that is to be tested. When the test patterns are supplied, the logic circuit 109 provides the resulting output signal 110 to the comparator 115.

A delay circuit 111 adds delay time to the expected pattern 112 for adjusting the timing of comparing the output signal from the logic circuit 109 with the expected patterns, since both the formatter 106 and the logic circuit 109 have delay times for generating output signals. That is, the delay time of the delay circuit 111 is selected for providing the delayed expected pattern 117 to the comparator 115 at the same time that the output signal 110 from the logic circuit 109 is supplied to the comparator 115. Similarly, a delay circuit 113 is provided for delaying the control data 114 from the pattern generator 104 for adjusting the timing for selecting the outputs from the comparator 115.

The comparator 115 compares the output signal 110 from the logic circuit under test 109 with the delayed expected pattern 117, and allows a coincidence signal to be generated when the control data from the delay circuit 113 is at high level. When both signals coincide with each other and the control data is at high level, the coincidence signal 103 goes to high level. The coincidence signal 103 is used for detecting the initial state of the logic circuit, so that the test patterns are supplied to the logic circuit 109 after obtaining the initial state in the logic circuit 109. When the control data 118 is at low level, the comparator 115 provides a comparison signal at a terminal 119. That is, when the output signals from the logic circuit are not equal to the expected pattern 117, the comparator 115 generates a comparison signal indicating that the logic circuit under test does not work correctly and is thus to be eliminated. The timing for generating the coincidence signal or the comparison signal is determined by a strobe signal 120 supplied to the comparator 115. A delay time $T_d$, between the clock signal 102 and the occurrence of the strobe pulse 120, is set to be equal to or greater than the sum of the delay times of the pattern generator 104, the formatter 106 and the logic circuit 109.

In the pattern generator 104 in FIG. 1, the expected pattern $E_0$, which indicates the data equal to that of the output data of the logic circuit 109 when its internal state is set to the initial state, is stored in the address 0. The data $D_0$ in the address 0 of the pattern generator 104 provides an increment pattern for sequentially incrementing the internal state of the logic circuit under test. The increment pattern $D_0$ depends on the logic circuit that is to be tested, and is known beforehand from, for instance, the technical description of the logic circuit.

In the logic circuit test system of FIG. 1, at the start of the operation, the address 0 of the pattern generator 104 is repeatedly accessed by the program counter 101 for incrementing the internal state of the logic circuit 109. By comparing the output signal 110 of the logic circuit 109 with the expected pattern $E_0$ indicating the initial state of the logic circuit 109 in each time slot, the logic circuit test system searches for the initial state of the logic circuit 109 to be tested. When the initial state is achieved, the comparator 115 provides the coincidence signal 103 to the program counter 101. After receiving the coincidence signal 103, the program counter 101 increments the address 105 sequentially in synchronism with the clock signal 102. Thus, the addresses 1,2,3 . . . of the pattern generator are sequentially accessed. In this way the logic circuit test system of FIG. 1 can test a logic circuit which does not have a terminal for being set to the initial state, such as a reset terminal, by supplying the test patterns sequentially to the logic circuit after the initial state is determined.

However, in this conventional logic circuit test system, if the time period of the clock signal 102 is smaller than the time required for generating the coincidence signal from the comparator 115 after the clock signal 102, that is, smaller than the delay time $T_d$ mentioned above, the internal state of the logic circuit under test is advanced to the next state by the increment pattern before being supplied with the actual test pattern following the increment pattern. Namely, in the logic circuit test system of FIG. 1, in the case that a delay time $T_d$, which is determined by the strobe pulse 120 corresponding to the sum of the delay times of the pattern generator 104, the formatter 106 and the logic circuit 109, is greater than the time period of the clock signal 102, the internal state of the logic circuit 109 is incremented and becomes different from the initial state, as a result of the clock signal supplied during the delay time $T_d$. Also, the number of steps of the difference from the initial state varies with change in the time period of the clock signal 102.

FIGS. 2-102 to 103 and 3-102 to -103 show timing charts for explaining the above problem. These are for the cases wherein the delay time $T_d$ is required for the coincidence signal 103 to be generated by the comparator 115, after the respective clock signal 102 is provided, and wherein the time period $T_p$ of the clock signal 102 is smaller than the delay time $T_d$. It is assumed for the timing charts that the internal state of the logic circuit under test reaches the initial state during the second time slot, as a result of successively receiving the increment pattern $D_0$. Namely, in the examples of the timing charts, the initial state is achieved by the increment pattern $D_0$ corresponding to the second pulse 2 of the clock signal 102.

As illustrated in FIGS. 2-102 to -103, by the first pulse 1 of the clock signal 102, the increment pattern $D_0$ is generated, and the logic circuit 109 is incremented by the increment pattern $D_0$ so that the output is changed to a signal X after the delay time $T_d$. As a result of the second pulse 2 of the clock signal 102, the output signal 110 of the logic circuit 109 eventually becomes $E_0$, which indicates the initial state of the logic circuit 109. Since the output signal $E_0$ and the expected pattern $E_0$ are the same, the comparator 115 generates a coincidence signal 103 after the delay time $T_d$. The program counter 101 generates the address 1 in response to the clock signal immediately following the coincidence signal 103, that is, in synchronism with the fifth pulse 5 of the clock signal 102. After that, the program counter 101 is incremented in the order of one step upon every occurrence of the clock signal 102, and thus the patterns $D_1, D_2, D_3 \ldots$, the expected patterns $E_1, E_2 \ldots$ and the control data 0, 0, 0 . . . are sequentially generated.

In the case of FIGS. 2-102 to 103, the output signal $O_1$ in response to the test pattern $D_1$ is derived after incrementing the internal state by two steps from the initial state. That is, the internal state of the logic circuit 109 is separated from the initial state $E_0$ by the two steps A and B, as illustrated in FIG. 2-110. Since the test pattern $D_1$ has to be supplied to the logic circuit 109 immediately after the initial state, the correct test result is not obtained from the output signal $D_1$ which is three steps from the initial state. In FIG. 3-102 a longer period of the clock signal 102 than that of FIG. 2-102 is illustrated. The delay time $T_d$ illustrated in FIGS. 3-110 and -103 is identical to that of FIGS. 2-110 and -103, since the components are the same for both cases. As a result, in the case of FIG. 3 the internal state of the logic circuit 109 has advanced by only the one step A, when the test pattern $D_1$ is supplied to the logic circuit 109.

Thus, in both the above cases, the internal state of the logic circuit under test differs from the initial state when the actual test patterns are provided after the increment pattern. Further, the number of steps by which the internal state differs from the initial state varies with the change of the period of the clock signal 102 as described above.

If the number of steps by which the internal state differs from the initial state is fixed and previously known, it is possible to test the logic circuit by supplying the test patterns successively after the initial state is provided in the logic circuit under test 109. For example, in the case of testing a logic circuit which repeats its internal states every 60 steps of the increment pattern, and for which the number of steps by which the internal state differs from the initial state is fixed for instance at 3, it is necessary to supply the increment pattern 57 times to the logic circuit 109, after the coincidence signal 103, to bring the logic circuit to the next initial state. Therefore, by supplying the test patterns $D_1$–$D_n$, after repeating 57 times the supplying of the increment pattern $D_0$, the test patterns can be sequentially supplied to the logic circuit successively beginning with the initial state of the logic circuit 109.

However, in the conventional logic circuit test system, the number of steps by which the internal state differs from the initial state varies with the period of the clock signal 102. In testing a logic circuit, it is important to evaluate the logic circuit by changing the repetition rate of the clock signal. Therefore, sufficient test results cannot be obtained for the logic circuit of the kind as described above with the prior art logic circuit test system.

SUMMARY OF THE INVENTION

It is an object of the present invention to provide a logic circuit test system which is capable of testing a logic circuit whose initial state is obtained only by repeatedly supplying an increment pattern a predetermined number of times.

It is another object of the present invention to provide a logic circuit test system which is capable of making constant the number of steps by which the internal state differs from the initial state of the logic circuit, regardless of the period of a clock signal, so that test patterns can be supplied to the logic circuit immediately after the initial state.

According to this invention, a synchronized delay circuit is provided for supplying a coincidence signal from a comparator to a program counter by adding a delay time that is synchronized with the clock signal supplied to the program counter. In this invention, the coincidence signal is supplied to the program counter after a fixed number of pulses of the clock signal, regardless of the period of the clock signal. Accordingly, the number of steps by which the internal state differs from the initial state, that is, at the time that the test patterns are supplied to the logic circuit under test, is fixed without regard to the period of the clock signal.

Therefore, it is possible to supply the test patterns to the logic circuit at the internal state after the second occurrence of the initial state, by successively supplying the increment pattern a predetermined number of times after obtaining the coincidence signal from the synchronized delay circuit. As a result, for the logic circuit of the type described above, a correct test can be provided by the logic circuit test system in accordance with the present invention.

BRIEF DESCRIPTION OF THE DRAWINGS

FIGS. 2-102 to -103 and 3-102 to -103 are timing charts for explaining the operation of the conventional logic circuit test system shown in FIG. 1.

FIG. 4 shows a block diagram of a logic circuit test system of the present invention.

FIG. 5 is a circuit diagram showing an example of a synchronized delay circuit for the embodiment of FIG. 4.

FIGS. 6-102 to -203 and 7-102 to -203 are timing charts for explaining the operation of the embodiment of FIG. 4.

DETAILED DESCRIPTION OF THE PREFERRED EMBODIMENTS

Figure 1:
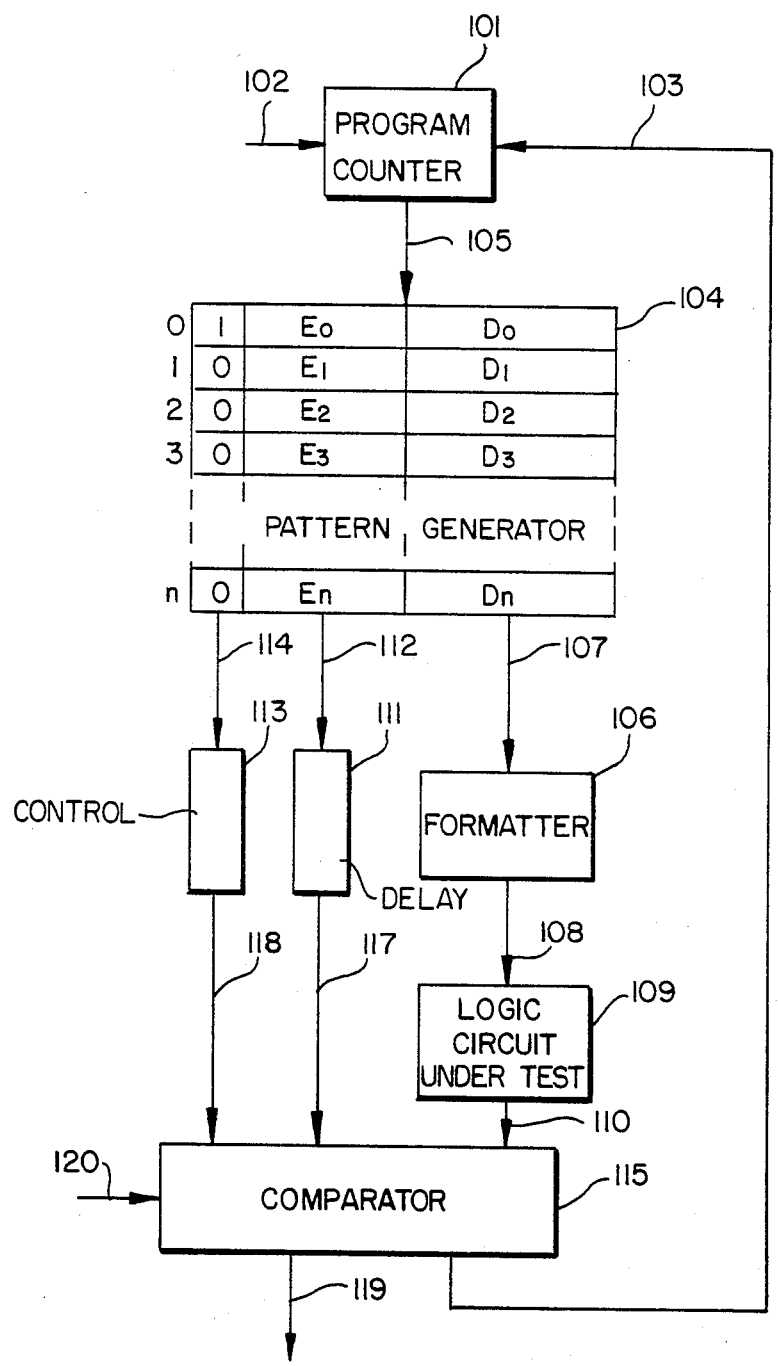
FIG. 1 shows a block diagram of a conventional logic circuit test system.
Figure 2:
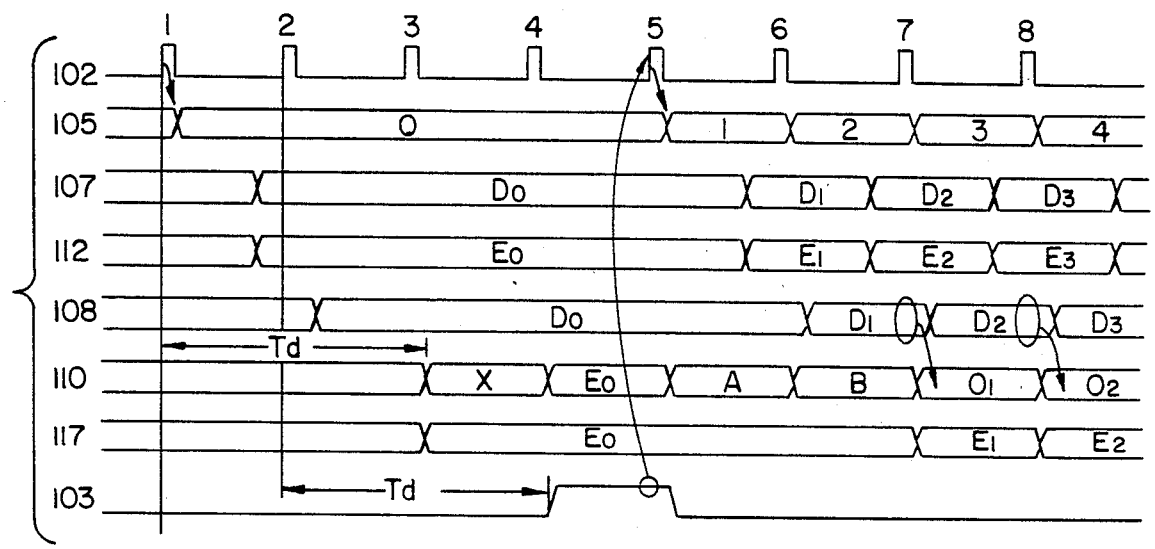
Figure 3:
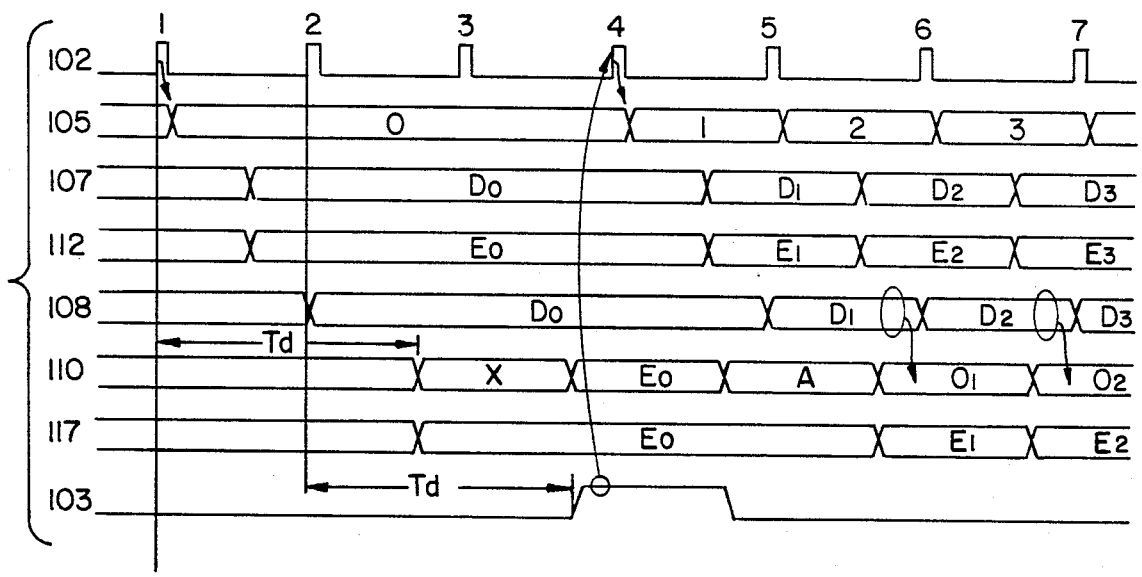

FIG. 4 shows a block diagram of a preferred embodiment of the present invention. In FIG. 4 the components that are identical to those in FIG. 1 are denoted by the same reference characters.

A synchronized delay circuit 220 is provided with a coincidence signal 116 from a comparator 115 and a clock signal 102. The synchronized delay circuit 220 adds a delay time to the coincidence signal 116 and provides the delayed coincidence signal 203 to a program counter 101 in synchronization with the clock signal 102. The program counter 101 repeatedly generates the address 0 in synchronism with the clock signal 102 when the coincidence signal 203 is not supplied, whereas it successively generates addresses incremented by one step in synchronism with the clock signal 102 after being provided with the coincidence signal 203 from the synchronized delay circuit 220.

The address 105 from the program counter 101 is supplied to a pattern generator 104. In the pattern generator 104, test patterns $D_0$, $D_1$, $D_2$, $D_3$ . . . , expected patterns $E_0$, $E_1$, $E_2$, $E_3$ . . . and control data 1, 0, 0, 0 . . . are stored, for providing the signals 107, 112 and 114, respectively. The test patterns 107 are shaped by a formatter 106 to predetermined waveform shapes such as RZ, NRZ, etc. A logic circuit 109 that is to be tested generates the output signal 110 in response to the test pattern 108 from the formatter 106. The output signal 110 is provided to a comparator 115 whose other terminal is supplied with the expected pattern 112 via a delay circuit 111. A strobe pulse 120 is also provided to the comparator 115. The timing of the comparison by the comparator 115 is determined by the strobe pulse 120 supplied to the comparator 115. A delay time $T_d$ between the clock signal 102 to the strobe pulse 120 is provided in consideration of the delay times of each of the pattern generator 104, the formatter 106 and the logic circuit under test 109. That is, the delay time $T_d$ is selected to be equal to or greater than the total delay time of the pattern generator 104, the formatter 106 and the logic circuit 109. When the output signal 110 and the expected pattern 117 coincide with each other, the comparator 115 generates a coincidence signal 116 in synchronism with the strobe pulse 120 and provides it to the synchronized delay circuit 220.

Figure 6:
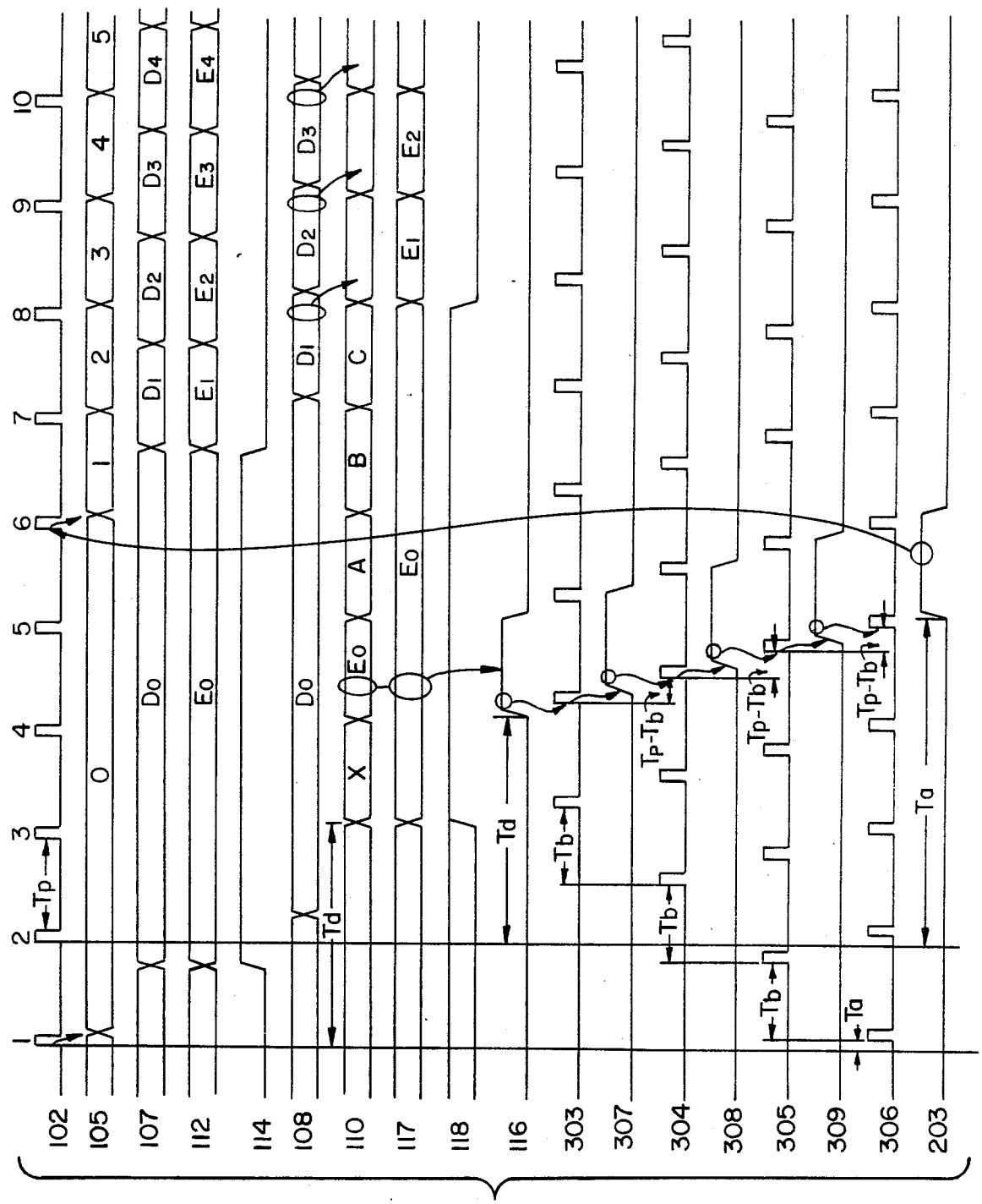
Figure 7:
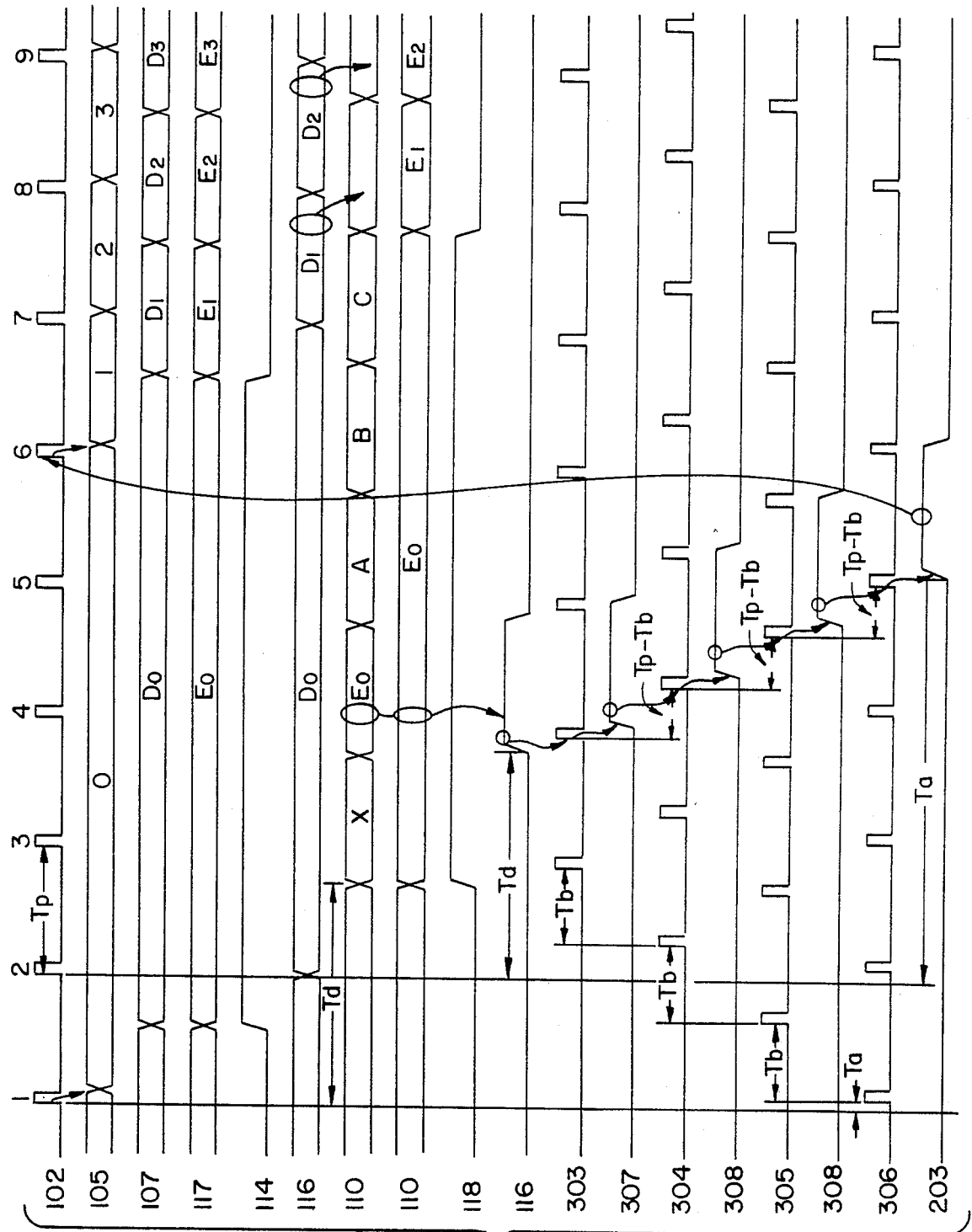

A detailed circuit configuration of the synchronized delay circuit 220 is illustrated in FIG. 5. D-type flip-flops 331 to 334 are connected in series, and delay elements 321 to 324 add respective delay times to the clock signal 102. Each clock terminal of the flip-flops 331 to 334 is supplied with the clock signal respectively delayed by the delay elements 321 to 324. The delay time $t_b$ of each of the delay elements 322 to 324 is selected to be smaller than the minimum time period of the clock signal 102 to be used in the logic circuit test system. The delay time $t_a$ of the delay element 321 as illustrated in FIGS. 6-306 and 7-306 is selected to be equal to or greater than the set-up time of the flip-flops 331 to 334. If the set-up time of the flip-flop is negligible, the delay element 321 is not required in this circuit configuration. Also the sum of the delay time of the delay elements 322 to 324 is selected to be equal to or greater than the delay time $T_d$ which starts with the respective clock signal 102 and ends at the corresponding comparison timing. By the clock signals 303 to 306, each of which is delayed by a respective predetermined time from the clock signal 102, the flip-flops 331 to 334 take in the coincidence signal 116 and provide the delayed and synchronized coincidence signal 203 at the output of the synchronized delay circuit.

FIGS. 6-102 to -203 and 7-103 to 203 are timing charts for explaining the operation of the preferred embodiment of FIGS. 4 and 5, for the cases wherein clock signals of different time periods are used, similarly as in the above. For both cases the program counter 101 generates the address 0 repeatedly by the clock signal 102 at the start of the operation. By the address 0 from the program counter 101, the pattern generator 104 generates the increment pattern $D_0$ which increments the internal state of the logic circuit 109, the expected pattern $E_0$ which indicates the initial state of the logic circuit 109 and the control data 1 which selects either one of the output signals from the comparator 115, as illustrated in FIGS. 6- and 7-107, -112 and -114, respectively. The expected pattern $E_0$ and the control data 1 are respectively delayed by the delay circuits 111 and 113 and provided to the comparator 115 (as shown in FIGS. 6- and 7-117 and -118). The increment pattern $D_0$ is supplied to the logic circuit 109 after being wave shaped by the formatter 106. The internal state of the logic circuit 109 is incremented by the increment pattern $D_0$ and provides the resulting output signal 110 to the comparator 115. When the output signal 110 agrees with the expected pattern $E_0$, the comparator 115 generates the coincidence signal 116.

In the example, by the second increment pattern $D_0$, corresponding to the second pulse 2 of the clock signal 102 as described above, the initial state is assumed to be obtained in the logic circuit 109. The coincidence signal 116 is taken into the flip-flop 334 by the respectively delayed second pulse of the clock signal 303. The output signal 307 of the flip-flop 334 is next taken into the flip-flop 333 by the respectively delayed third pulse of the clock signal 304. The output signal 308 of the flip-flop 333 is taken into the flip-flop 332 by the respectively delayed fourth pulse of the clock signal 305, and the output signal 309 of the flip-flop 332 is taken into the flip-flop 331 by the respectively delayed fifth pulse of the clock signal 306. Thus the coincidence signal 203 which is delayed and synchronized with the clock signal 102 is generated by the synchronized delay circuit 220, and is provided to the program counter 101.

When the coincidence signal 203 is provided, the program counter 101 is stopped from repeating the address 0 and, by the clock signal 102 immediately following the coincidence signal 203, the program counter 101 generates the next address 1. After that the pattern generator 104 is sequentially addressed by the addresses 1, 2, 3 . . . incrementing in a sequential order and provides the actual test patterns $D_1$, $D_2$, $D_3$ following the increment pattern $D_0$ to the logic circuit 109. The number of steps by which the internal state of the logic circuit under test differs from the initial state is fixed, in this example 3 steps from the initial state as depicted by the outputs A, B and C of the logic circuit under test in FIGS. 6-110 and 7-110.

Let it be assumed that the time period of the clock signal 102 is $T_p$, the time required for obtaining the coincidence signal 116 from the comparator 115 after the corresponding pulse of the clock signal 102 is $T_d$ as in the above, the delay time of each of the delay elements 322 to 324 is $t_b$ and that the sum of the three delay times $t_b$ required further embodiment of FIG. 5 is equal to the delay time $T_d$. A delay time $T_a$, which is the time interval between the coincidence signal 203 and the second pulse 2 of the clock signal 102 as illustrated in FIGS. 6-203 and 7-203, is calculated as follows:

$$T_a = 3t_b + t_a + 3(T_p - t_b) \quad (1)$$
$$= 3T_p + t_a$$

wherein $t_a$ is the set-up time of the flip-flops 331 to 334, and the propagation delay time of each of the flip-flops 331 to 334 is neglected. Namely, as indicated in equation (1), the time $T_a$ is at all times equal to the sum of three times the clock period $T_p$ and the set-up time $t_a$, even though the repetition rate of the clock signal 102 is changed. The set-up time $t_a$ is very small in contrast to the period $T_p$, and thus the delay time $T_a$ becomes very close to $3T_p$ although being somewhat greater. By the clock signal 102 immediately following the coincidence signal 203, the address sequence which begins at address 1 is started in the program counter 101. In other words, the address sequence for generating the actual test patterns after the increment pattern always starts in this example after $4T_p$ from the clock signal corresponding to the initial state of the logic circuit 109, that is, four clock pulses, after the second pulse 2 of the clock signal 102. Therefore, the number of steps by which the internal state differs from the initial state is fixed, i.e., 3 steps in the above examples of the timing charts of the present invention, regardless of the repetition rate of the clock signal 102.

Since the number of steps by which the internal state differs from the initial state is fixed and known in advance, the actual test patterns can be supplied to the logic circuit under test beginning with the initial state. For example, for the logic circuit above which repeats the initial state every 60 times the internal state is incremented, the pattern generator 104 further stores the increment pattern $D_0$ in the addresses from the address 1 to address 57 and stores the test patterns $D_1$, $D_2$, $D_3$ . . . in the addresses after the address 57. Therefore, the test patterns $D_1$, $D_2$, $D_3$ . . . are supplied in the time slots immediately after the next occurrence of the initial state of the logic circuit under test.

As has been mentioned above, according to this invention, a correct test can be provided for the logic circuits wich do not have a specific terminal for initializing their internal state and thus have to be initialized by repeatedly being provided with increment patterns.

What is claimed is:

1. A system for testing a logic circuit having an initial state with respect to which test patterns are to be supplied, comprising a clock for supplying clock pulses, a pattern generator for storing at a plurality of addresses respective thest pattern data and expected patterns corresponding to respective ones of said test patterns, and for outputting same according to the address thereof that is selectively accessed, said test pattern data including an increment pattern at at least one respective one of said addresses for incrementing the internal state of said logic circuit, a program counter for providing in synchronism with said clock pulses the addresses of said pattern generator to be accessed for providing the respective test pattern data for testing said logic circuit, wherein said program counter outputs at least one address of said pattern generator with said increment pattern until a coincidence signal is received corresponding to said logic circuit having been set to said initial state, after which said program counter increments said addresses, a comparator for comparing each output of said logic circuit corresponding to each said test pattern with the respective expected pattern, and for outputting said coincidence signal corresponding to said initial state of said logic device being detected, and a synchronized delay circuit for providing said coincidence signal to said program counter with a first delay of at least a predetermined number of said clock pulses, wherein the testing of said logic circuit occurs so that at least the first of said test patterns other than said increment pattern is provided to a respective desired state of said logic circuit.

2. The system of claim 1, wherein the period of said clock pulses can be selectively changed without changing said predetermined number of said clock pulses of said delay for providing said coincidence signal to said program counter.

3. The system of claim 2, said synchronized delay circuit comprising
a series of flip-flops, wherein said coincidence signal is provided from said comparator to said program counter via said series of flip-flops, and the number of said series of flip-flops corresponds to said predetermined number of clock pulses, and
a series of delay elements for controlling the transferring of said coincidence signal via said series of flipflops, wherein the output of at least all but the last of said series of flip-flops are delayed to provide said coincidence signal to said program counter with said first delay, said clock pulses being provided to each said flip-flop from respective points of said series of delay elements.

4. The system of claim 3, wherein the delay time of each of said series of delay elements is shorter than the period of said clock pulses.

5. The system of claim 4, comprising each of said series of flip-flops having a set-up time, and said synchronized delay circuit including a further delay element for receiving said clock pulses and outputting the respectively delayed clock pulses to said series of delay elements, wherein the delay time of said further delay element corresponds to the total of the set-up times.

6. The system of claim 1, 2, 3, 4 or 5, comprising said pattern generator storing the expected pattern corresponding to said initial state at least at said at least one respective address thereof with the increment pattern, and storing control data at least at said at least one respective address with the increment pattern and at each address having a test pattern data other than said increment pattern, wherein said coincidence signal is provided to said program counter according to the respective control data.

7. The system of claim 6, comprising said pattern generator storing the expected patterns corresponding to each said test pattern data other than said increment pattern at the respective addresses, and storing control data at each address storing said test pattern data other than said increment pattern, wherein said comparator provides a signal for rejecting said logic circuit under test when the expected pattern does not agree with the respective output of said logic circuit corresponding to a respective one of said test pattern data other than said increment pattern.

8. The system of claim 6, wherein said increment pattern is stored in a predetermined plurality of incrementing addresses of said pattern generator, wherein the number of said predetermined plurality of incrementing addresses is determined by said predetermined number of clock pulses and the number of internal states of said logic circuit.

9. The system of claim 7, wherein said increment pattern is stored in a predetermined plurality of incrementing addresses of said pattern generator, wherein the number of said predetermined plurality of incrementing addresses is determined by said predetermined number of clock pulses and the number of internal states of said logic circuit.

* * * * *

UNITED STATES PATENT AND TRADEMARK OFFICE
CERTIFICATE OF CORRECTION

PATENT NO. : 4,584,683
DATED : 22 April 1986
INVENTOR(S) : MASAO SHIMIZU

It is certified that error appears in the above-identified patent and that said Letters Patent is hereby corrected as shown below:

Col. 1, line 13, "patters" should be --patterns--;
line 21, "test" (first occurrence) should be --test,--.

Col. 8, line 30, "wich" should be --which--;
line 39, "thest" should be --test--.

Col. 9, line 15, "flipflops" should be --flip-flops--.

Signed and Sealed this

Seventh Day of October, 1986

[SEAL]

Attest:

DONALD J. QUIGG

Attesting Officer

Commissioner of Patents and Trademarks